US012542256B2

(12) United States Patent
Fu et al.

(10) Patent No.: US 12,542,256 B2
(45) Date of Patent: Feb. 3, 2026

(54) BATCH PROCESSING CHAMBERS FOR PLASMA-ENHANCED DEPOSITION

(71) Applicant: Applied Materials, Inc., Santa Clara, CA (US)

(72) Inventors: Jianming Fu, Palo Alto, CA (US); Tza-Jing Gung, San Jose, CA (US); Sanjeev Baluja, Campbell, CA (US); Haitao Wang, Santa Clara, CA (US); Mandyam Sriram, San Jose, CA (US); Srinivas Gandikota, Santa Clara, CA (US); Steven V. Sansoni, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 533 days.

(21) Appl. No.: 17/991,379

(22) Filed: Nov. 21, 2022

(65) Prior Publication Data

US 2024/0170254 A1 May 23, 2024

(51) Int. Cl.
*H01J 37/32* (2006.01)
*C23C 16/455* (2006.01)
*C23C 16/509* (2006.01)

(52) U.S. Cl.
CPC .... *H01J 37/3211* (2013.01); *C23C 16/45536* (2013.01); *C23C 16/45544* (2013.01);
(Continued)

(58) Field of Classification Search
CPC ........ C23C 16/45544; C23C 16/45536; C23C 16/509; C23C 16/45546; C23C 16/45574;
(Continued)

(56) References Cited

U.S. PATENT DOCUMENTS 4,633,811 A * 1/1987 Maruyama .............. C23C 16/52 118/50.1
5,795,452 A * 8/1998 Kinoshita ........... H01J 37/3405 156/345.46

(Continued)

FOREIGN PATENT DOCUMENTS

| | | | |
|---|---|---|---|
| JP | 2006278652 | A | 10/2006 |
| KR | 20110000861 | A | 1/2011 |
| WO | 2014080067 | A1 | 5/2014 |

OTHER PUBLICATIONS

PCT International Search Report and Written Opinion in PCT/US2023/037173 dated Mar. 14, 2024, 9 pages.

*Primary Examiner* — Joseph A Miller, Jr.
(74) *Attorney, Agent, or Firm* — SERVILLA WHITNEY LLC

(57) ABSTRACT

Embodiments of the disclosure are directed to PEALD batch processing chambers. Some embodiments are directed to processing chambers having one or more inductively coupled plasma (ICP) coils electrically connected to at least one RF power source. Some embodiments are directed to processing chambers having a wafer cassette comprising a plurality of platforms, each platform configured to support at least one wafer for processing, and one or more RF power sources electrically connected to the plurality of platforms in the wafer cassette. In some embodiments, the plurality of platforms have a first set of electrodes having a first polarity and a second set of electrodes having a second polarity, and one or more RF power sources electrically connected to the plurality of platforms in the wafer cassette.

4 Claims, 9 Drawing Sheets

(52) U.S. Cl.
CPC ...... *C23C 16/509* (2013.01); *H01J 37/32715* (2013.01); *H01J 2237/332* (2013.01)

(58) Field of Classification Search
CPC ............. H01J 37/3211; H01J 37/32899; H01J 37/32715
See application file for complete search history.

(56) References Cited

U.S. PATENT DOCUMENTS

| | | | | |
|---|---|---|---|---|
| 7,540,257 | B2 * | 6/2009 | Kishimoto | H01J 37/32431 118/723 E |
| 8,211,235 | B2 | 7/2012 | Lindfors et al. | |
| 8,741,062 | B2 | 6/2014 | Lindfors et al. | |
| 8,753,716 | B2 | 6/2014 | Soininen et al. | |
| 9,831,099 | B2 | 11/2017 | O'Meara et al. | |
| 9,972,501 | B1 | 5/2018 | Kuyel | |
| 11,280,001 | B2 | 3/2022 | Kilpi et al. | |
| 2007/0010072 | A1 | 1/2007 | Bailey et al. | |
| 2012/0279658 | A1 | 11/2012 | Bolden et al. | |
| 2016/0189951 | A1 * | 6/2016 | Lee | C23C 16/4584 438/782 |
| 2019/0194809 | A1 | 6/2019 | Holm et al. | |
| 2020/0102645 | A1 | 4/2020 | Wang et al. | |
| 2021/0098233 | A1 | 4/2021 | Kapoor et al. | |
| 2021/0104399 | A1 | 4/2021 | Kuroda et al. | |

* cited by examiner

BATCH PROCESSING CHAMBERS FOR PLASMA-ENHANCED DEPOSITION

TECHNICAL FIELD

Embodiments of the disclosure generally relate to batch processing chambers. In particular, embodiments of the disclosure are related to plasma enhanced atomic layer deposition (PEALD) batch processing chambers.

BACKGROUND

Deposition of films on a substrate is an important process in a variety of industries including semiconductor processing, diffusion barrier coatings, and dielectrics. In the semiconductor industry, in particular, miniaturization requires atomic level control of film deposition to produce conformal coatings on high aspect structures. One method for deposition of films with control and conformal deposition is atomic layer deposition (ALD), which employs sequential surface reactions to form layers of a same precise thickness on all parts of a structure. Most ALD processes are based on binary reaction sequences which deposit a binary compound film. Because the surface reactions are sequential, the two gas phase reactants are not in contact, and possible gas phase reactions that may form and deposit particles are limited.

Most film properties cannot meet practical requirements due to lack of continuity, lack of conformality, poor film thickness control, and poor film composition control, such as hydrogen contamination and/or different bonding states of carbon in the film. Traditionally, films formed by chemical vapor deposition (CVD) and physical vapor deposition (PVD) processes are often non-continuous and not conformal. Additionally, the CVD process generally has less thickness control than an ALD process and/or can result in the creation of gas phase particles which can cause defects in the resultant device. Thermal atomic layer deposition (ALD) methods typically provide films with higher impurities and higher resistivity. Further, these processes must be performed at relatively high substrate temperatures.

In contrast, plasma enhanced atomic layer deposition (PEALD) methods add a plasma exposure. In some PEALD methods, a nitrogen source is provided as a plasma, for example, ammonia plasma. The primary benefit of PEALD methods is the relatively low substrate temperature during processing.

However, current batch process chambers and processes implementing batch process chambers do not include the use of plasma. Inductively coupled plasma (ICP) or remote plasma sources, for example, are sometimes used as an upstream disassociation of chemistry prior to entering a batch process chamber to filter or lower the ion energy. Rather, current PEALD chambers and processes are reserved for single wafer or multi-wafer single process due to complexity (twin or quad or multi-quad processing).

Accordingly, there is a need for PEALD batch processing chambers for processing a plurality of wafers having superior growth rate and films of higher quality.

SUMMARY

One or more embodiments of the disclosure are directed to a processing chamber comprising a housing with a lid, two opposed sidewalls, and a bottom defining an interior volume; a wafer processing region within the interior volume, the wafer processing region including a wafer cassette therein and the wafer cassette comprising a plurality of platforms, each platform configured to support at least one wafer for processing; and one or more inductively coupled plasma (ICP) coils electrically connected to at least one RF power source.

Additional embodiments of the disclosure are directed to a processing chamber comprising a housing with a lid, two opposed sidewalls, and a bottom defining an interior volume; a wafer processing region within the interior volume, the wafer processing region including a wafer cassette therein and the wafer cassette comprising a plurality of platforms, each platform configured to support at least one wafer for processing; and one or more RF power sources electrically connected to a plurality of platforms in the wafer cassette.

Further embodiments of the disclosure are directed to a processing chamber comprising a housing with a lid, two opposed sidewalls, and a bottom defining an interior volume; a wafer processing region within the interior volume, the wafer processing region including a wafer cassette therein and the wafer cassette comprising a plurality of platforms, each platform configured to support at least one wafer for processing, the plurality of platforms having a first set of electrodes having a first polarity and a second set of electrodes having a second polarity; and one or more RF power sources electrically connected to the plurality of platforms in the wafer cassette.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
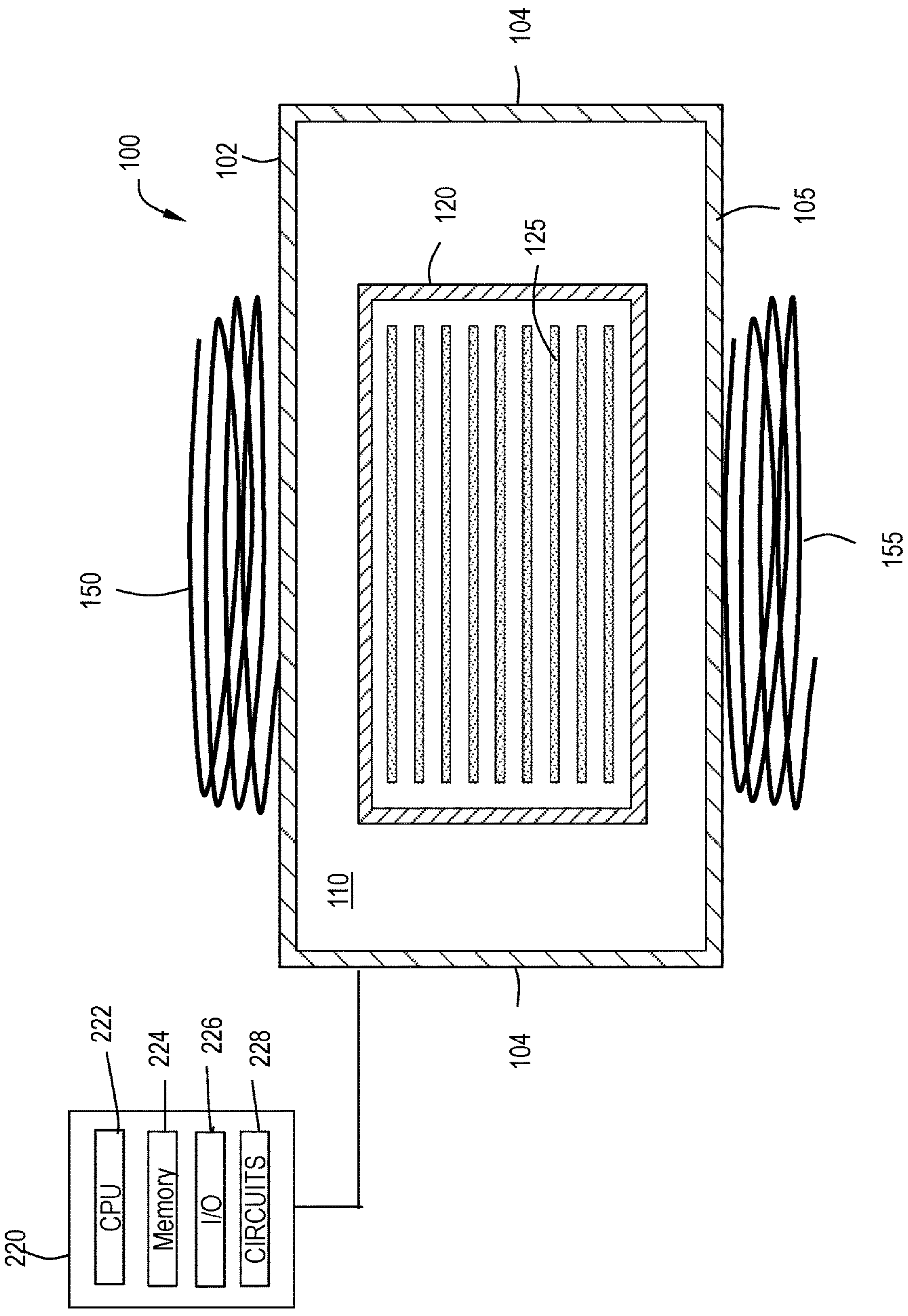
FIG. 1 illustrates a schematic cross-sectional view of an embodiment of a processing chamber having one or more inductively coupled plasma (ICP) coils.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. The reactive gases are prevented from mixing by the purging of the processing chamber between subsequent exposures.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the processing gases. During substrate movement, different portions of the substrate surface, or material on the substrate surface, are exposed to the two or more reactive compounds so that any given point on the substrate is substantially not exposed to more than one reactive compound simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In one aspect of a time-domain ALD process, a first reactive gas (i.e., a first precursor or compound A) is pulsed into the reaction zone followed by a first time delay. A second precursor or compound B is pulsed into the reaction zone followed by a second delay. During each time delay, a purge gas, such as argon, is introduced into the processing chamber to purge the reaction zone or otherwise remove any residual reactive compound or reaction products or byproducts from the reaction zone. Alternatively, the purge gas may flow continuously throughout the deposition process so that only the purge gas flows during the time delay between pulses of reactive compounds. The reactive compounds are alternatively pulsed until a predetermined film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In one aspect of a spatial ALD process, a first reactive gas and second reactive gas (e.g., hydrogen radicals) are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to the first reactive gas and the second reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Plasma enhanced atomic layer deposition (PEALD) is a widely used technique for depositing thin films on a substrate. In some examples of a PEALD processes, a material may be formed from the same chemical precursors as thermal ALD processes, but at a higher deposition rate and a lower temperature. A PEALD process, in general provides that a reactant gas and a reactant plasma are sequentially introduced into a process chamber containing a substrate. The first reactant gas is pulsed in the process chamber and is adsorbed onto the substrate surface. Thereafter, the reactant plasma is pulsed into the process chamber and reacts with the first reactant gas to form a deposition material, e.g., a thin film on a substrate. Similar to a thermal ALD process, a purge step may be conducted between the delivery of each of the reactants. Embodiments described herein in reference to a PEALD process can be carried out using any suitable thin film deposition system. Any apparatus description described herein is illustrative and should not be construed or interpreted as limiting the scope of the embodiments described herein.

Embodiments of the present disclosure relate to plasma enhanced atomic layer deposition (PEALD) batch processing chambers. Some embodiments of the disclosure advantageously provide PEALD batch processing chamber for processing a plurality of wafers, each wafer having a film formed thereon. The PEALD batch processing chambers described herein advantageously produce higher quality films, including but not limited to, films having a reduced amount of impurities, lower stress, and lower resistivity.

Examples of batch processing chambers suitable for modification in accordance with the teachings provided herein include the PICOSUN® Sprinter ALD system, commercially available from Applied Materials, Inc., of Santa Clara, Calif. The SEMI S2/S8 certified PICOSUN® Sprinter ALD system processes batches of 300 mm wafers for high throughput and high reliability ALD. The PICOSUN® Sprinter ALD system performs processes including, but not limited to, ALD of metal nitrides and metal oxides such as aluminum oxide ($Al_2O_3$), silicon oxide ($SiO_2$), silicon nitride (SiN), and titanium oxide ($TiO_2$). Advantageously, the PICOSUN® Sprinter ALD system is configured to process batches of wafers more than 100 wafers an hour @ 10 nm $Al_2O_3$thickness at temperatures in a range of from greater than or equal to 90° C. to less than or equal to 400° C. The PICOSUN® Sprinter ALD system includes fully laminar precursor flows ensuring perfect ALD deposition with no parasitic CVD growth. The precursor systems are configured to flow liquid, solid, gas, and/or ozone precursors. The PICOSUN® Sprinter ALD system may include a continuous dispenser for pyrophoric precursors. Compared to vertical furnace reactors typically used for batch ALD processing, PICOSUN® Sprinter ALD system provides higher film quality with lower thermal budget, so it is suitable also for temperature-sensitive devices.

The PICOSUN® Sprinter ALD system combines very fast process times (e.g., less than or equal to 8 seconds, without any uniformity degradations) with smaller batch sizes than in vertical furnaces, which allows greater production flexibility and minimized risk without sacrificing throughput. The standard Sprinter cluster configuration consists of two ALD modules, a central wafer-handling robot with pre-heating and cooling chambers, and an equipment front end module (EFEM) station to load/unload wafers from/to front opening uniform pods (FOUPs).

Figure 2:
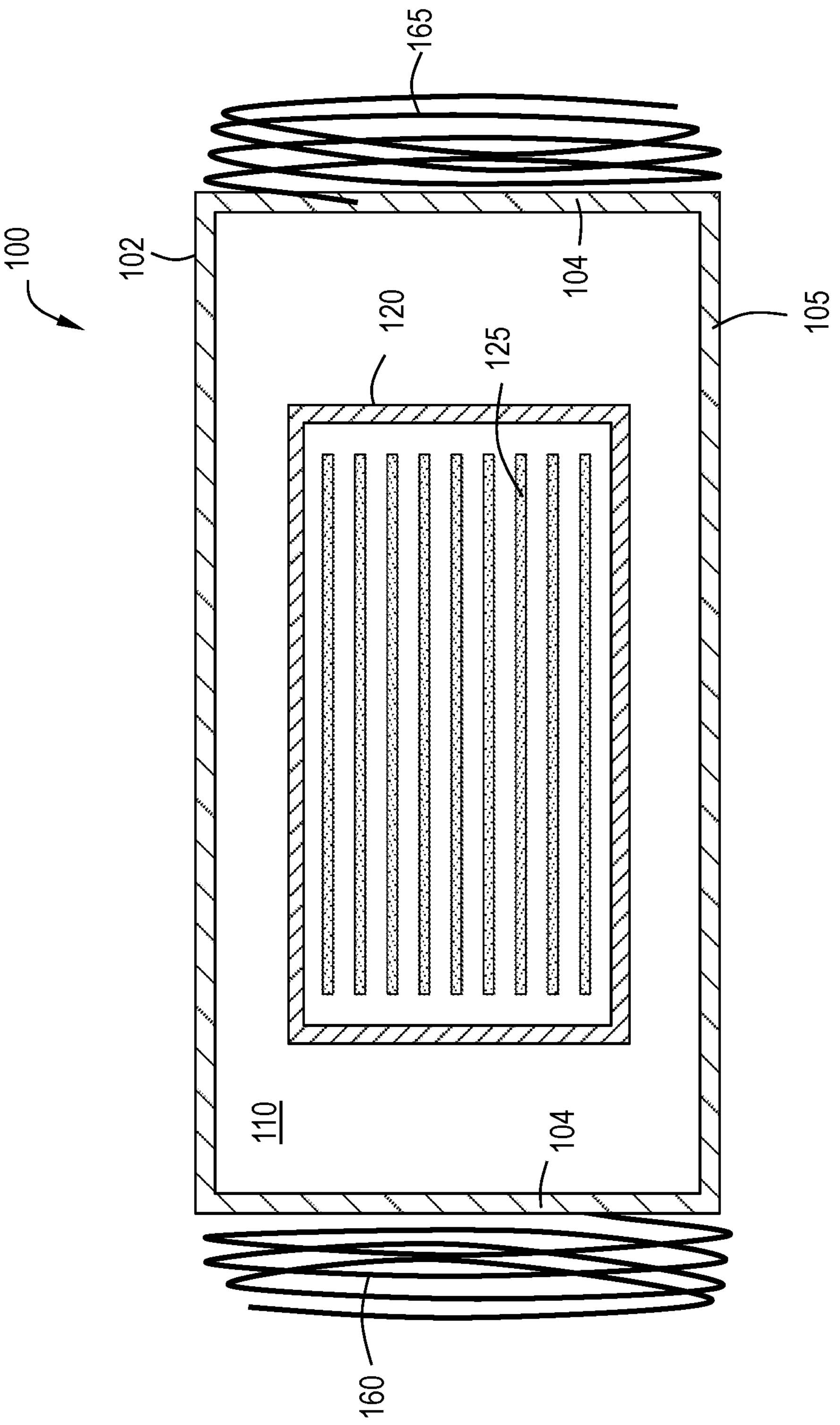
FIG. 2 illustrates a schematic cross-sectional view of another embodiment of a processing chamber having one or more inductively coupled plasma (ICP) coils.

The embodiments of the disclosure are described by way of the Figures, which illustrate batch processing chambers, improved inductively coupled plasma (ICP) type plasma source and improved capacitively coupled plasma (CCP) type plasma sources in accordance with one or more embodiments of the disclosure. Referring to FIGS. 1-2, a processing chamber 100 comprises a housing with a lid 102, two opposed sidewalls 104, and a bottom 105 defining an interior volume 110, and a wafer processing region 120 within the interior volume 110. In some embodiments, there is a wafer cassette within the wafer processing region 120, the wafer cassette comprising a plurality of platforms, each platform of the plurality of platforms configured to support at least one wafer 125 for processing. FIGS. 3-7 illustrate schematic enlarged views of a wafer processing region (e.g., the wafer processing region 120) in a processing chamber (e.g., processing chamber 100) having a capacitively coupled plasma (CCP) type plasma source according to one or more embodiments of the disclosure.

Referring again to FIG. 1, in some embodiments, the processing chamber 100 comprises a top ICP coil 150 positioned above the lid 102 and a bottom ICP coil 155 positioned below the bottom 105.

The top ICP coil 150 and the bottom ICP coil 155 generate an ICP by directing the energy of a radio frequency (RF) power source (not shown) into a suitable gas. The suitable reactive gas can be any reactive gas known to the skilled artisan. In some embodiments, the gas includes one or more of argon (Ar), helium (He), or nitrogen ($N_2$). In some embodiments, the gas includes one or more of a silane ($Si_xH_y$) or oxygen ($O_2$). The plasma is "coupled" by generating a magnetic field by passing a high frequency electric current through one or more of the top ICP coil 150 or the bottom ICP coil 155. This inductor generates a rapidly oscillating magnetic field oriented in the vertical plane of one or more of the top ICP coil 150 or the bottom ICP coil 155. Ionization of the flowing argon is initiated by igniting one or more of the top ICP coil 150 or the bottom ICP coil 155. The resulting ions and their associated electrons from the one or more of the top ICP coil 150 or the bottom ICP coil 155 then interact with the fluctuating magnetic field. This generates enough energy to ionize atoms of the reactive gas by collision excitation.

In some embodiments, the processing chamber 100 comprises a first side ICP coil 160 positioned adjacent one of the two opposed sidewalls 104 and a second side ICP coil 165 positioned adjacent the other of the two opposed sidewalls 104. In embodiments comprising the first side ICP coil 160 and the second side ICP coil 165, the processing chamber 100 advantageously maintains enough space between each of the opposed sidewalls 104 and the at least one wafer 125, so plasma generates at the sidewall area and diffuses to the wafer region 120.

In some embodiments, the processing chamber 100 comprises a first side ICP coil 160 positioned adjacent one of the two opposed sidewalls 104 and a second side ICP coil 165 positioned adjacent the other of the two opposed sidewalls 104. In some embodiments, one or more of the first side ICP coil 160 or the second side ICP coil 165 wraps around the two opposed sidewalls 104.

In some embodiments, one or more of the top ICP coil 150 or the bottom ICP coil 155 is wrapped around the entire processing chamber 100 (not shown). In some embodiments, one or more of the top ICP coil 150 or the bottom ICP coil 155 that is wrapped around the entire processing chamber 100 is formed from a dielectric material, such as quartz. The processing chamber having one or more of the top ICP coil 150 or the bottom ICP coil 155 that is wrapped around the entire processing chamber has any suitable shape. In embodiments where one or more of the top ICP coil 150 or the bottom ICP coil 155 is wrapped around the entire processing chamber 100 (not shown), the processing chamber is a cylindrical chamber. In embodiments where one or more of the top ICP coil 150 or the bottom ICP coil 155 is wrapped around the entire processing chamber 100 (not shown), the processing chamber is a rectangularly shaped chamber where the top ICP coil 150 and/or the bottom ICP coil 155 is positioned perpendicular to an inlet and/or an outlet of gas flow in the chamber.

In some embodiments, one or more of the first side ICP coil 160 or the second side ICP coil 165 is wrapped around the entire processing chamber 100 (not shown). In some embodiments, one or more of the first side ICP coil 160 or the second side ICP coil 165 that is wrapped around the entire processing chamber 100 is formed from a dielectric material, such as quartz. The processing chamber having one or more of the first side ICP coil 160 or the second side ICP coil 165 that is wrapped around the entire processing chamber has any suitable shape. In embodiments where one or more of the first side ICP coil 160 or the second side ICP coil 165 is wrapped around the entire processing chamber 100 (not shown), the processing chamber is a cylindrical chamber. In embodiments where one or more of the first side ICP coil 160 or the second side ICP coil 165 is wrapped around the entire processing chamber 100 (not shown), the processing chamber is a rectangularly shaped chamber where the first side ICP coil 160 and/or the second side ICP coil 165 is positioned perpendicular to an inlet and/or an outlet of gas flow in the chamber.

FIGS. 3-7 illustrate schematic enlarged views of a wafer processing region (e.g., the wafer processing region 120) in a processing chamber (e.g., processing chamber 100) having a capacitively coupled plasma (CCP) type plasma source according to one or more embodiments of the disclosure.

The wafer cassette 120 includes comprises a plurality of platforms 214, 216, each platform of the plurality of platforms 214, 216 configured to support at least one wafer 125 for processing. The plurality of platforms 214, 216 comprises a first set of platforms 214 alternating with a second set of platforms 216.

Figure 3A:
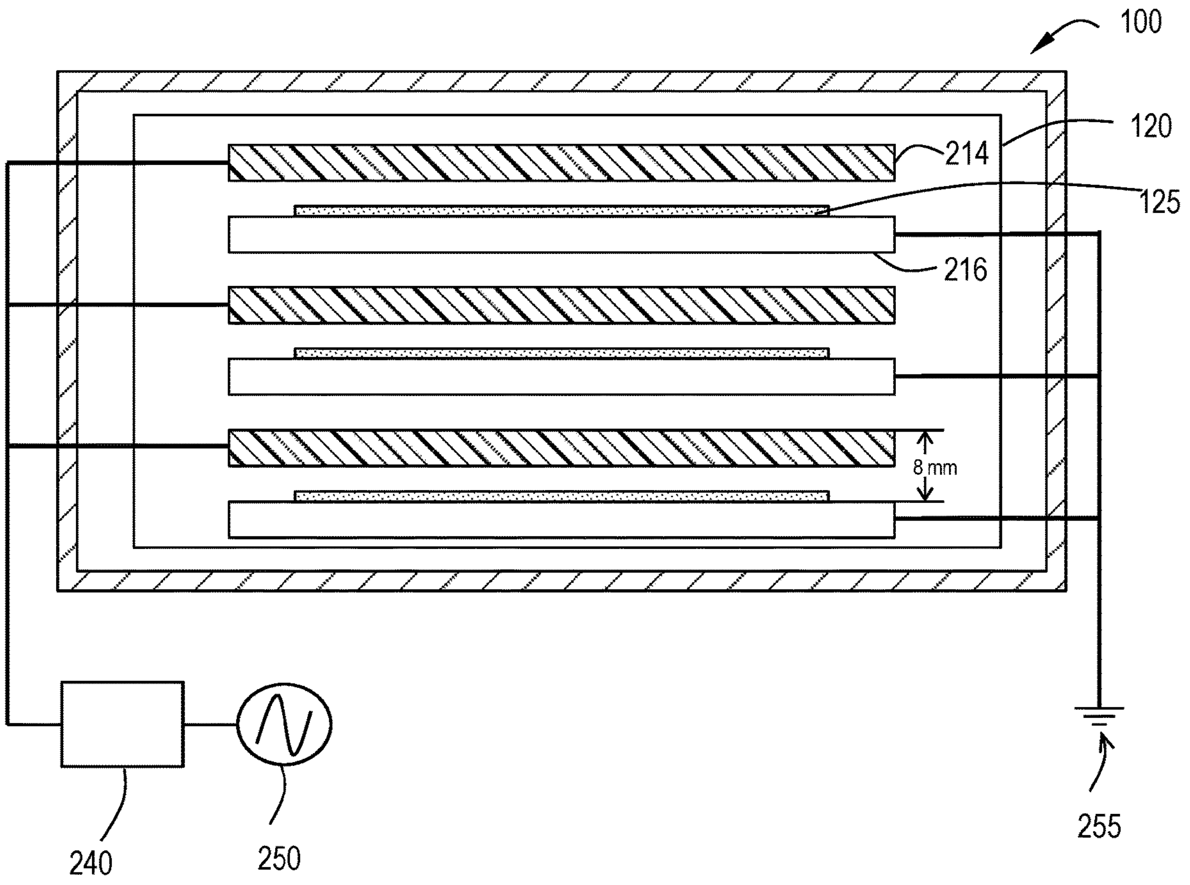
FIG. 3A illustrates a schematic enlarged view of an embodiment of a wafer processing region in a processing chamber having a capacitively coupled plasma (CCP) type plasma source.

FIG. 3A illustrates the plurality of platforms 214, 216, where the first set of platforms 214 are electrically connected to a RF power source 250. Without intending to be bound by theory, any suitable number of RF power sources may be connected to the plurality of platforms 214, 216. The RF power source may be any suitable power source known to the skilled artisan. The RF power source may include an RF generator 250 and a matching circuit 240, for example, to minimize reflected RF energy reflected back to the RF generator 250 during operation. For example, RF energy supplied by the RF power source 250 may range in frequency from about 13.56 MHz to about 162 MHz or above. For example, non-limiting frequencies such as 13.56 MHz, 27.12 MHz, 40.68 MHz, 60 MHz, or 162 MHz can be used. In some embodiments, the RF power source 250 is a hot RF power source. In some embodiments, the RF power source 250 comprises a capacitively coupled plasma (CCP) source. In one or more embodiments where the RF power source 250 comprises a capacitively coupled plasma (CCP) source, some of the first set of platforms 214 and/or some of the second set of platforms 216 are floated by adding a capacitor to the electrically grounded 255 second set of platforms 216.

In some embodiments, some or all of the second set of platforms 216 are electrically grounded 255. In some embodiments, some of the second set of platforms 216 are electrically grounded to the bottom 105 of the processing chamber 100. In some embodiments, some of the second set of platforms 216 are electrically grounded to one or more of the sidewalls 104 of the processing chamber 100.

In some embodiments, one or more of the second set of platforms has at least one wafer 125 thereon. In some embodiments, each of platforms of the second set of platforms has at least one wafer 125 thereon.

In some embodiments, the plurality of alternating platforms 214, 216 comprises the first set of platforms 214 which are electrically connected to an RF power source 250 (e.g., an RF hot power source) and the second set of platforms 216 which are electrically grounded 255.

In FIGS. 3-7, there is a space between the first set of platforms 214 and an adjacent second set of platforms 216 having at least one wafer 125 thereon that defines a process gap. In some embodiments, the process gap comprises a space in a range of from 4 mm to 12 mm between each of the first set of platforms 214 and an adjacent second set of platforms 216. In the illustrated embodiment of FIG. 3A, the process gap between each of the first set of platforms 214 and an adjacent second set of platforms 216 is 8 mm.

Figure 3B:
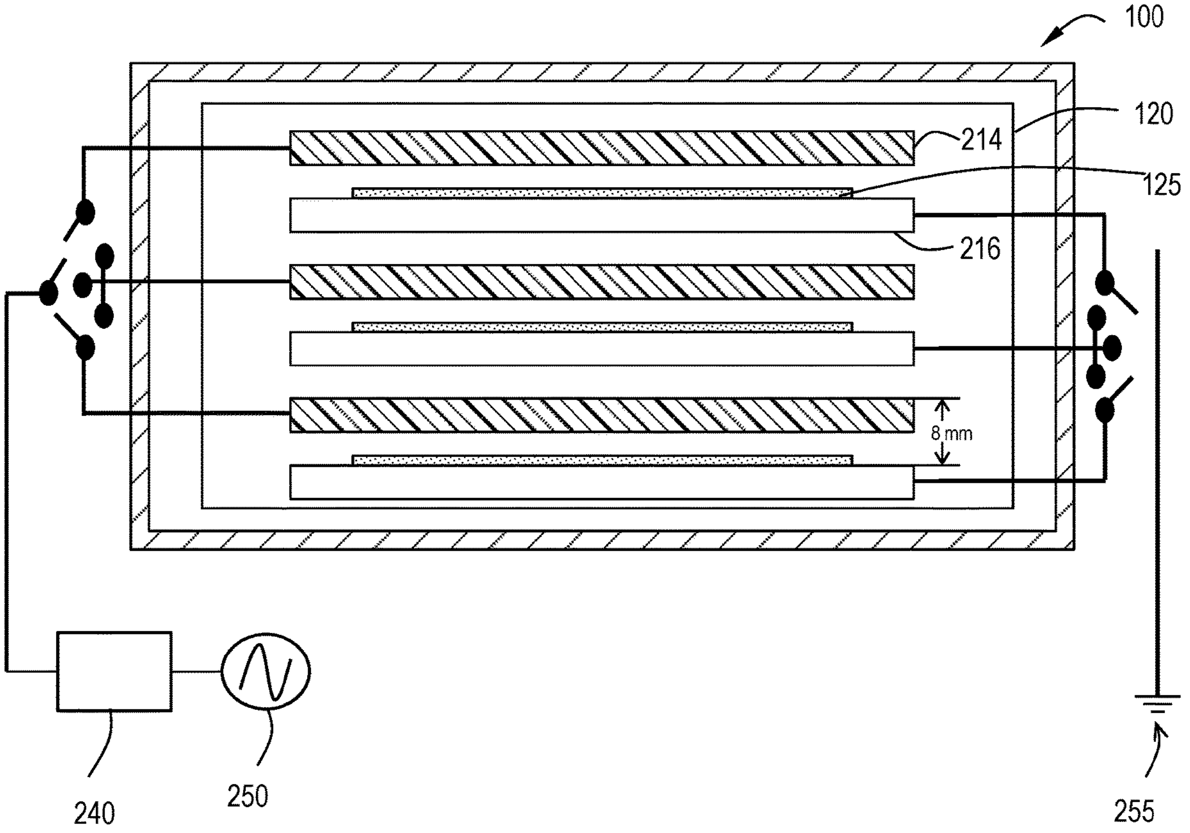
FIG. 3B illustrates a schematic enlarged view of another embodiment of a wafer processing region in a processing chamber having a capacitively coupled plasma (CCP) type plasma source.

FIG. 3B illustrates a plurality of platforms 214, 216 comprising the first set of platforms 214 which are electrically connected to an RF power source 250 (e.g., an RF hot electrode) alternating with a second set of platforms 216 which are electrically grounded 255. FIG. 3B illustrates a processing chamber 100 which implements power switching to power one set of platforms 214, 216 at a time. In some embodiments, only one of the RF power source 250 (e.g., an RF hot electrode) or the grounded electrode 255 is turned on during treating a wafer 125 on one or more of the first set of platforms 214 or the second set of platforms 216. In specific embodiments where only one of the RF power source 250 (e.g., an RF hot power source) or the grounded electrode 255 is turned on, the processing chamber 100 is advantageously configured to treat one wafer 125 of the batch of wafers 125 at a time. Embodiments of the disclosure advantageously provide processing chambers 100 for treating one wafer 125 of the batch of wafers 125 at a time without having to incorporate one or more single wafer processing chambers.

In the illustrated embodiment of FIG. 3B, the process gap between each of the first set of platforms 214 and an adjacent second set of platforms 216 is 8 mm.

Figure 4A:
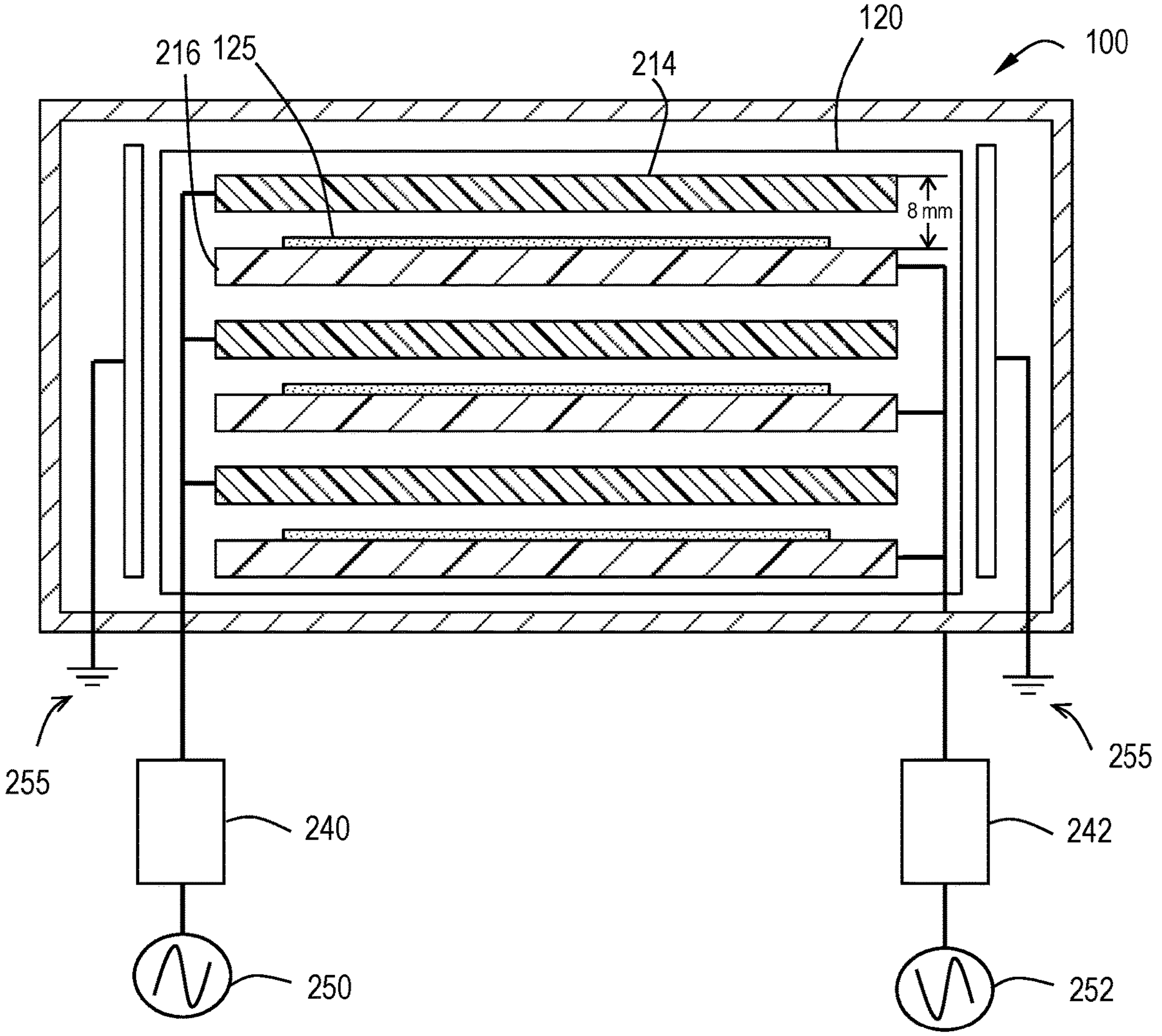
FIG. 4A illustrates a schematic enlarged view of another embodiment of a wafer processing region in a processing chamber having a capacitively coupled plasma (CCP) type plasma source.

Referring to FIG. 4A, in some embodiments, some of the platforms of the first set of platforms 214 are out of phase. In specific embodiments, RF power is applied to one or more of the first set of platforms 214 and/or an adjacent second set of platforms 216, 180 degrees out of phase from each other, and drives the RF current back and forth in a push-and-pull fashion.

In the illustrated embodiment of FIG. 4A, there are two RF power sources 250, 252. The RF power sources 250, 252 may include an RF generator 250 (e.g., a first RF generator 250) and a matching circuit 240 (e.g., a first matching circuit), and a second RF generator 252 and a second matching circuit 242, for example, to minimize reflected RF energy reflected back to the first RF generator 250 and/or the second RF generator 252 during operation. The RF current enters in one source 250, 252, exits the source from the bottom, and comes back to the other source from the bottom and exits from the top electrode of the other source. The source can be driven by two RF power sources 250, 252 operating 180° out of sync, or by one RF power source 250, 252 that will feed two sides via a balun (coaxial transformer, conventional transformer, etc.). Continuity of the RF current through the two RF power sources 250, 252 will allow improved simultaneous operation of the two RF power sources 250, 252. In some embodiments, some of the first set of platforms 214 are electrically connected to the first RF power source 250 and some of the adjacent second set of platforms 214 are electrically connected to the second RF power source 252. In the illustrated embodiment of FIG. 4A, each of the first set of platforms 214 are electrically connected to the first RF power source 250 and each of the second set of platforms 214 are electrically connected to the second RF power source 252.

Figure 4B:
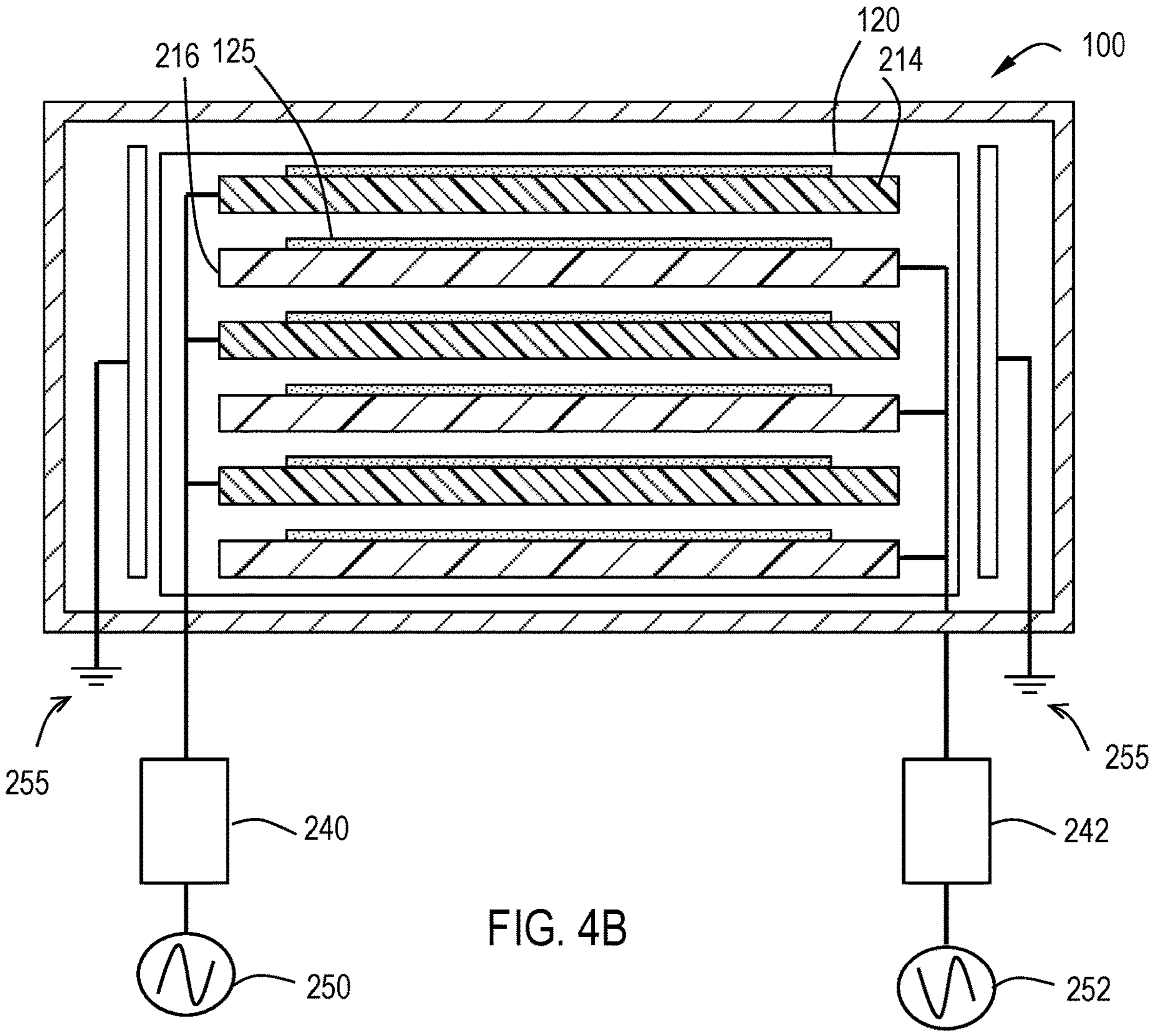
FIG. 4B illustrates a schematic enlarged view of another embodiment of a wafer processing region in a processing chamber having a capacitively coupled plasma (CCP) type plasma source.

In the illustrated embodiment of FIGS. 4A and 4B, there is a third set of electrodes 255 that are electrically grounded to one or more of the sidewalls 104 of the processing chamber 100. For illustrative purposes, the third set of electrodes 255 are shown to be adjacent the sidewalls 104 of the processing chamber 100. In one or more embodiments, the third set of electrodes 255 are embedded within one or more of the sidewalls 104 of the processing chamber 100.

In the illustrated embodiment of FIG. 4A, the process gap between each of the first set of platforms 214 and an adjacent second set of platforms 216 is 8 mm.

Referring to FIG. 4B, in specific embodiments, some of the first set of platforms 214 are electrically connected to the first RF power source 250, some of the first set of platforms 214 are electrically connected to the second RF power source 252, and some of the first set of platforms 214 are electrically connected to different poles of the first RF power source 250 and/or the second RF power source 252. In some embodiments, one or more of the first RF power 250 source and the second RF power source 252 is a hot RF power source.

Referring again to FIG. 3, in some embodiments, the plurality of platforms 214, 216 comprises the first set of platforms 214 which are electrically connected to an RF power source 250 (e.g., an RF hot power source) and an adjacent second set of platforms 216 which are electrically grounded 255.

Figure 5:
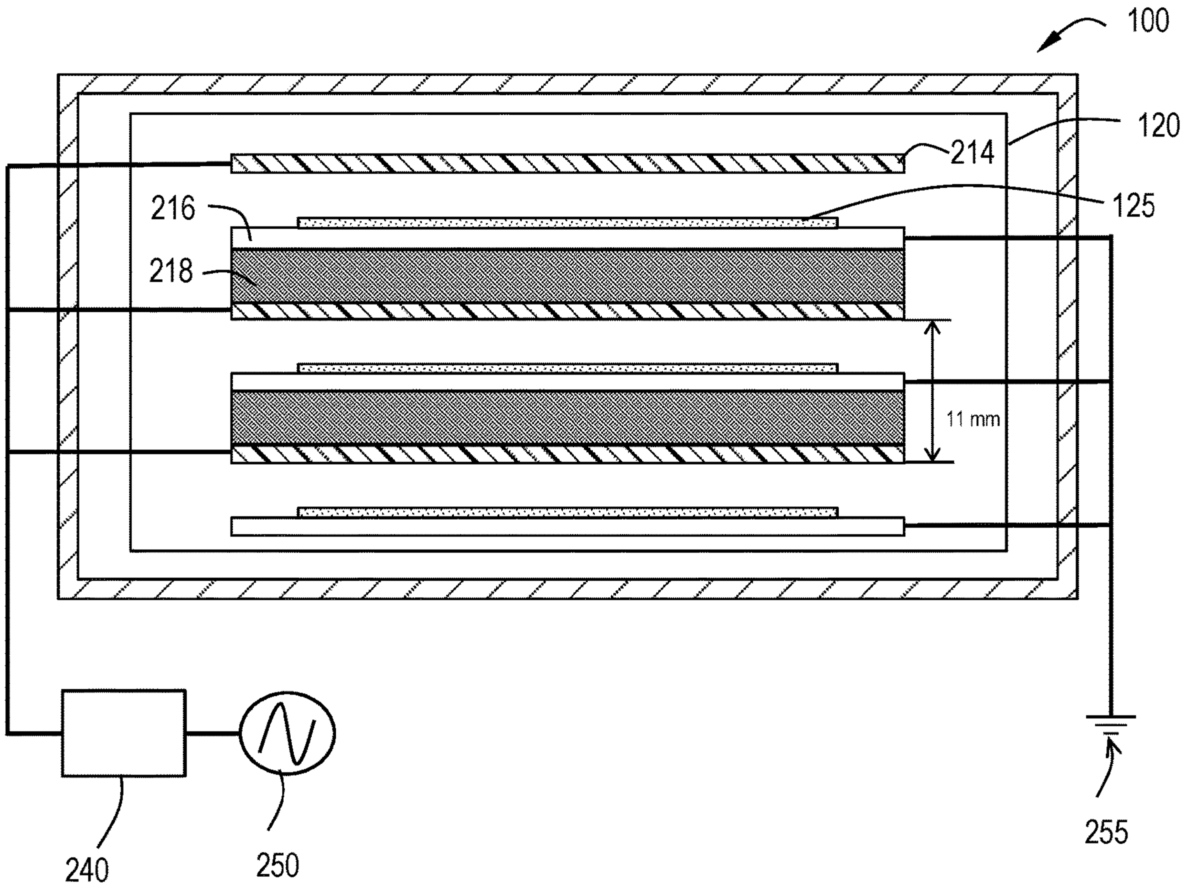
FIG. 5 illustrates a schematic enlarged view of another embodiment of a wafer processing region in a processing chamber having a capacitively coupled plasma (CCP) type plasma source.

Referring now to FIG. 5, the plurality of platforms 214, 216 comprises the first set of platforms 214 which are electrically connected to an RF power source 250 (e.g., an RF hot power source) and an adjacent second set of platforms 216 which are electrically grounded 255, and there is an insulator 218 between some of the first set of platforms 214 and the adjacent second set of platforms 216. In some embodiments, there is an insulator 218 between each of the first set of platforms 214 and each adjacent second set of platforms 216. The insulator 218 is configured to prevent direct electrical communication between the first set of platforms 214 and the adjacent second set of platforms 216. As used herein, "electrical communication" means that the components are connected either directly or through an intermediate component so that there is less electrical resistance.

In the illustrated embodiment of FIG. 5, the process gap between the first set of platforms 214 and an adjacent second set of platforms 216 having an insulator 218 therebetween is 11 mm.

In some embodiments, the processing chamber 100 comprises a plurality of platforms 214, 216 having a first set of electrodes having a first polarity and a second set of electrodes having a second polarity. In some embodiments, the first set of electrodes having the first polarity are within the first set of platforms 214. In some embodiments, the second set of electrodes having the second polarity are within the second set of platforms 216.

In some embodiments, the first set of electrodes and the second set of electrodes are electrically connected to different poles of the same RF power source 250, 252. In other embodiments, the first set of electrodes and the second set of electrodes are electrically connected to different RF power sources 250, 252. Each of the RF power sources 250, 252 may be set at the same frequency or at different frequencies.

Figure 6:
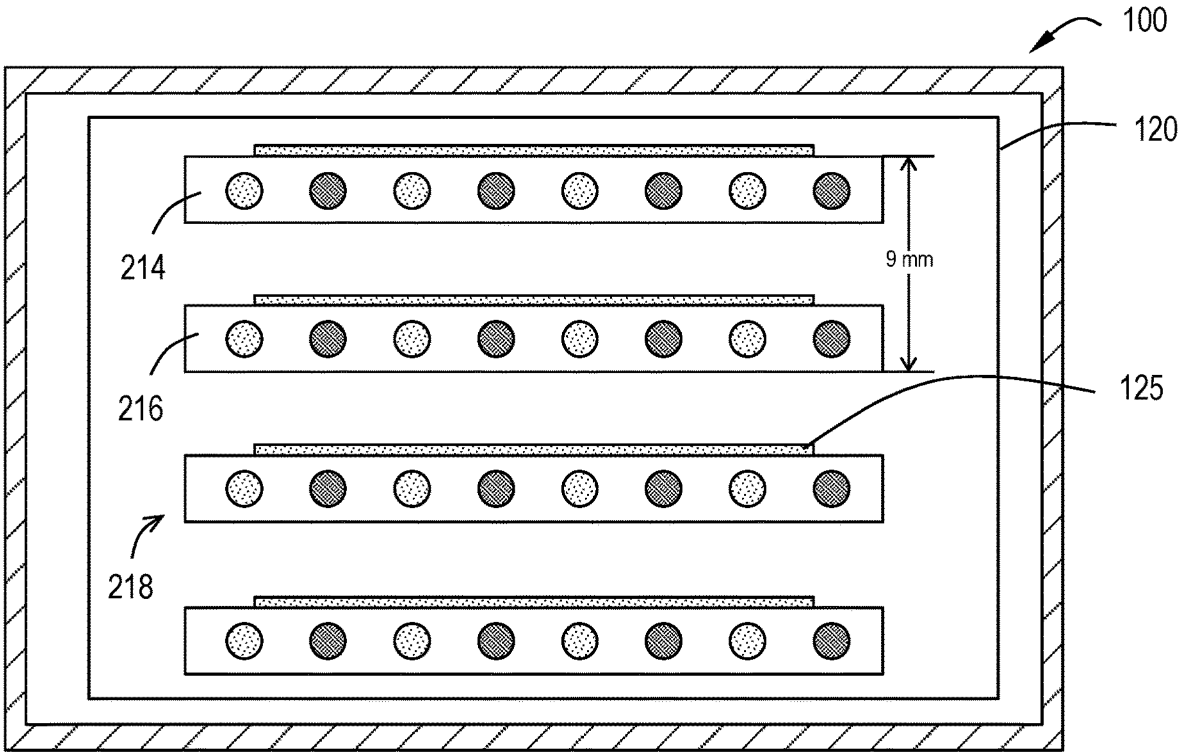
FIG. 6 illustrates a schematic enlarged view of another embodiment of a wafer processing region in a processing chamber having a capacitively coupled plasma (CCP) type plasma source.
Figure 7:
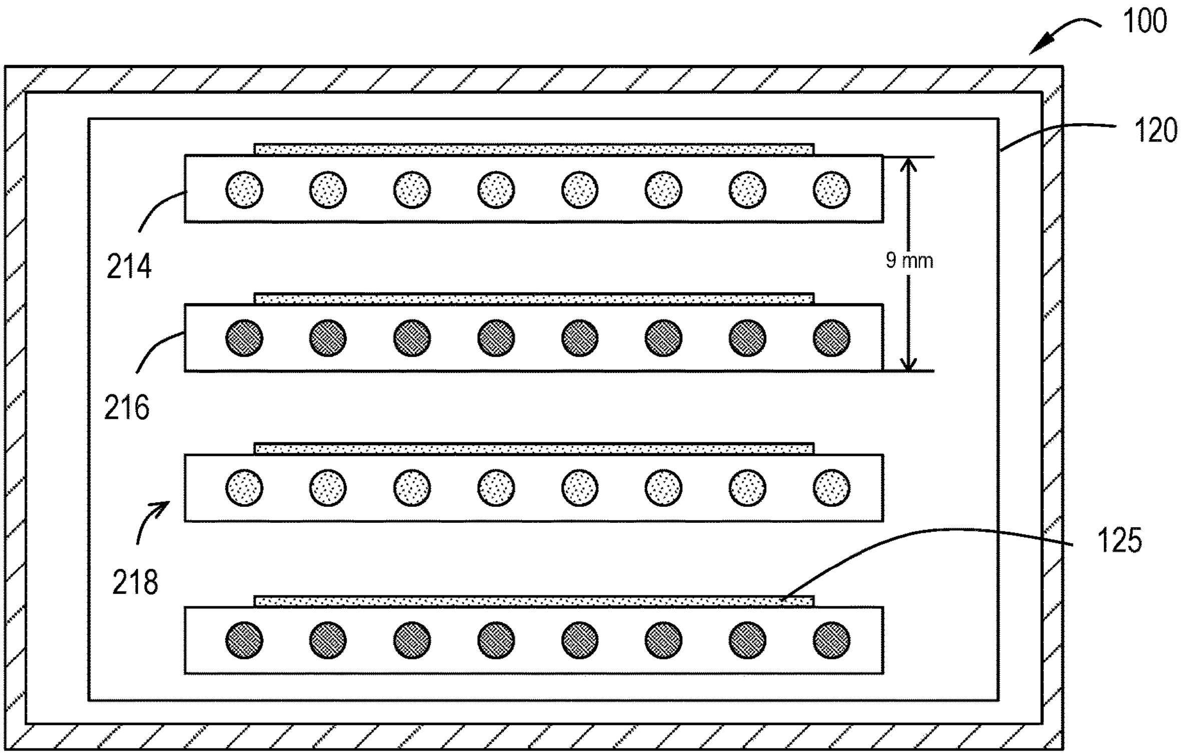
FIG. 7 illustrates a schematic enlarged view of another embodiment of a wafer processing region in a processing chamber having a capacitively coupled plasma (CCP) type plasma source.
Figure 8:
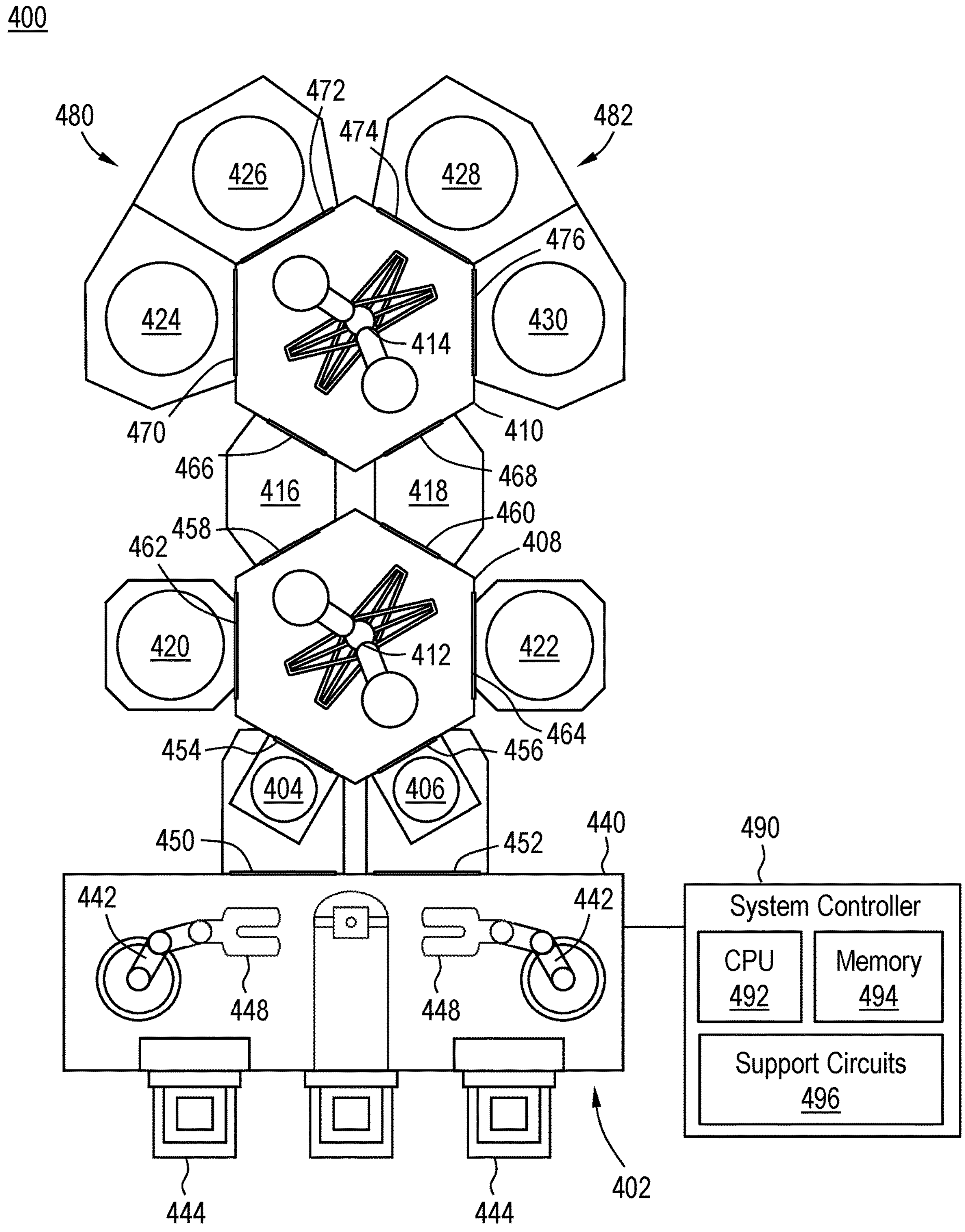
FIG. 8 illustrates a schematic top-view diagram of an example multi-chamber processing system according to one or more embodiments of the disclosure.

Referring to FIGS. 6 and 7, the plurality of platforms 214, 216 may have electrodes embedded within the platforms 214, 216. In the embodiments of FIGS. 6 and 7, an RF power source, such as RF power sources 250, 252 and grounded electrodes, such as grounded electrode 255 are not shown and are embedded within the platforms 214, 216. In some embodiments, each of the plurality of platforms 214, 216 having the first set of electrodes having the first polarity and a second set of electrodes having the second polarity is electrically insulating.

In one or more embodiments, some of the plurality of platforms 214, 216 are interspersed with the first set of electrodes and the second set of electrodes. In one or more embodiments, each of the plurality of platforms 214, 216 are interspersed with the first set of electrodes and the second set of electrodes. Referring to FIG. 6, in some embodiments, the process gap is 9 mm between the first set of platforms 214 and an adjacent second set of platforms 216 where some of the plurality of platforms 214, 216 are interspersed with the first set of electrodes and the second set of electrodes. In some embodiments, the process gap is 9 mm between the first set of platforms 214 and an adjacent second set of platforms 216 where each of the plurality of platforms 214, 216 are interspersed with the first set of electrodes and the second set of electrodes. In specific embodiments, the 9 mm process gap includes a 4 mm space between the first set of platforms 214 and the adjacent second set of platforms 216 and a 5 mm thick insulator.

In one or more embodiments, the plurality of platforms 214, 216 comprises platforms 214 having the first set of electrodes and alternating platforms 216 having the second set of electrodes. In some embodiments, the process gap is 9 mm between the first set of platforms 214 and an adjacent second set of platforms 216 where some of the platforms 214, 216 are platforms 214 having the first set of electrodes and some platforms are adjacent platforms 216 having the second set of electrodes.

In specific embodiments, the 9 mm process gap includes a 4 mm space between the first set of platforms 214 and the second set of platforms 216 and a 5 mm thick insulator.

In one or more embodiments, a plasma is generated between the first set of platforms 214 having the first electrode and an adjacent second set of platforms 216 having the second electrode. The plasma is generated using radio frequency (RF) from the at least one RF power source 250, 252. In one or more embodiments, alternating current (AC) power is rectified and switched to provide current to a RF amplifier. The RF amplifier operates at a reference frequency (13.56 MHz, for example), drives current through an output-matching network, and then through a power measurement circuit to the output of the power supply. The output match is usually designed to be connected a generator that is optimized to drive particular impedance, such as, for example, 50 ohms, in order to have the same characteristic impedance as the coaxial cables commonly used in the industry. Power flows through the matched cable sections, is measured by the match controller, and is transformed through the load match. The load match is usually a motorized automatic tuner, so the load match operation incurs a predetermined time delay before the system is properly configured. After passing through the load match, power is then channeled into a plasma excitation circuit that drives two electrodes in an evacuated processing chamber. A processing gas is introduced into the evacuated processing chamber, and when driven by the circuit, plasma is generated. Since the matching network or the load match is motorized, the response time from the matching network is typically on the order of one second or more.

In some embodiments, the plasma power is in a range of from about 10 W to about 1000 W, including from about 200 W to about 600 W. In some embodiments, the plasma power is less than or equal to about 1000 W, or less than or equal to about 6500 W.

The plasma frequency may be any suitable frequency. In some embodiments, the first RF power source 250 and the second RF power source 252 operate at the same frequency or at different frequencies. In some embodiments, the plasma has a frequency in a range of about 200 kHz to 30 MHz. In some embodiments, the plasma frequency is less than or equal to about 20 MHz, less than or equal to about 10 MHz, less than or equal to about 5 MHz, less than or equal to about 1000 kHz, or less than or equal to about 500 kHz. In some embodiments, the plasma frequency is greater than or equal to about 210 kHz, greater than or equal to about 250 kHz, greater than or equal to about 600 kHz, greater than or equal to about 750 MHz, greater than or equal to about 1200 kHz, greater than or equal to about 2 MHz, greater than or equal to about 4 MHz, greater than or equal to about 7 MHz, greater than or equal to about 12 MHz, greater than or equal to about 15 MHz, or greater than or equal to about 25 MHz. In one or more embodiments, the plasma has a frequency of about 13.56 MHz, or about 350 kHz, or about 400 kHz, or about 27 MHz, or about 40 MHz, or about 60 MHz.

In one or more embodiments, a controller 220 may be provided and coupled to various components of the processing chamber 100 to control the operation thereof. The controller 220 can be a single controller that controls the entire processing chamber 100, or multiple controllers that control individual portions of the processing chamber 100.

In some embodiments, the controller 220 includes a central processing unit (CPU) 222, a memory 224, inputs/outputs (I/O) 226, and support circuits 228. The controller 220 may control the processing chamber 100 directly, or via computers (or controllers) associated with particular process chamber and/or support system components.

The controller 220 may be one of any form of general-purpose computer processor that can be used in an industrial setting for controlling various chambers and sub-processors. The memory 224 or computer readable medium of the controller 220 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 224 can retain an instruction set that is operable by the processor (CPU 222) to control parameters and components of the processing chamber 200.

The support circuits 228 are coupled to the CPU 222 for supporting the processor in a conventional manner. These circuits include cache, power supplies, clock circuits, input/output circuitry and subsystems, and the like. One or more processes may be stored in the memory 224 as software routine that, when executed or invoked by the processor, causes the processor to control the operation of the processing chamber 100 or individual processing units (e.g., the first set of platforms 214 and/or the second set of platforms 216) in the manner described herein. The software routine may also be stored and/or executed by a second CPU (not shown) that is remotely located from the hardware being controlled by the CPU 222.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 220 has one or more configurations to execute individual processes or sub-processes to perform processes described herein. The controller 220 can be connected to and configured to operate intermediate components to perform the functions of the methods.

Embodiments of the present disclosure are directed to batch processing chambers comprising one or more remote plasma sources. The batch processing chambers described herein may include any suitable remote plasma source known to the skilled artisan. In some embodiments, the wafer processing region (e.g., the wafer processing region 120) in the processing chamber (e.g., processing chamber 100) has one or more remote plasma sources configured to expose each of the plurality of alternating platforms in the wafer cassette to a remote plasma according to one or more embodiments of the disclosure. In some embodiments, the processing chamber (e.g., processing chamber 100) has one or more remote plasma sources that are positioned outside of the wafer processing region and the remote plasma source(s) are configured to expose each of the plurality of alternating platforms in the wafer cassette to a remote plasma.

Described below is an embodiment of a method wherein a deposited film is formed on the surface of a substrate in the processing chamber 100 using an atomic layer deposition (ALD) process. The processing chamber 100 is configured to perform PEALD of metal nitrides and metal oxides such as aluminum oxide ($Al_2O_3$), silicon oxide ($SiO_2$), silicon nitride (SiN), and titanium oxide ($TiO_2$). Embodiments of the disclosure are advantageously directed to treating an ALD-formed film with a plasma in a process chamber, such as the PICOSUN® Sprinter ALD system. Embodiments of the disclosure are advantageously directed to treating an ALD-formed film with a plasma in a batch process chamber 100. The plasma may be generated from one or more remote plasma sources, ICP coils, and/or RF power sources as described herein. The method described below is exemplary and should not be construed as limiting. The methods of the disclosure may contain additional process steps to those described below.

Each process gas may be supplied under different parameters than other process gasses. A process gas may be provided in one or more pulses or continuously. The flow rate of a process gases can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. A process gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to a process gas may be any suitable amount of time necessary to allow the formation of an adequate nucleation layer or reaction atop the substrate surface. For example, a process gas may be flowed into the process chamber for a period of about 0.1 seconds to about 90 seconds. In some time-domain ALD processes, a process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as a process gas. The inert gas may be mixed with a process gas (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like.

The temperature of the substrate during deposition can be controlled, for example, by setting the temperature of the substrate support or susceptor. In some embodiments the substrate is held at a temperature in the range of about 100° C. to about 600° C., or in the range of about 200° C. to about 525° C., or in the range of about 300° C. to about 475° C., or in the range of about 350° C. to about 450° C. In one or more embodiments, the substrate is maintained at a temperature less than about 475° C., or less than about 450° C., or less than about 425° C., or less than about 400° C., or less than about 375° C.

In addition to the foregoing, additional process parameters may be regulated while exposing the substrate to a process gas. For example, in some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

After exposing the substrate to one process gas, the process chamber 100 (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of greater than 0 to about 10000 sccm to purge the process chamber.

The flow of inert gas may facilitate removing any excess process gases and/or excess reaction byproducts from the process chamber to prevent unwanted gas phase reactions. For example, the flow of inert gas may remove excess process gas from the process chamber, preventing a reaction between the first process gas and a subsequent process gas.

Then the substrate is exposed to a second process gas for a second period of time. The second process gas may reacts with the species on the substrate surface to create a deposited film. The second process gas may be supplied to the substrate surface at a flow rate greater than the first process gas. In one or more embodiments, the flow rate is greater than about 1 time that of the first process gas, or about 100 times that of the first process gas, or in the range of about 3000 to 5000 times that of the first process gas. The second process gas can be supplied, in time-domain ALD, for a time in the range of about 1 sec to about 30 sec, or in the range of about 5 sec to about 20 sec, or in the range of about 10 sec to about 15 sec. The second process gas can be supplied at a pressure in the range of about 1 Torr to about 30 Torr, or in the range of about 5 Torr to about 25 Torr, or in the range of about 10 Torr to about 20 Torr, or up to about 50 Torr. The substrate temperature can be maintained at any suitable temperature. In one or more embodiments, the substrate is maintained at a temperature less than about 475° C., or at a temperature about the same as that of the substrate during exposure to the first process gas.

The process chamber may again be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the embodiment of the processing method described above includes only two pulses of reactive gases, it will be understood that this is merely exemplary and that additional pulses of process gases may be used. The pulses can be repeated in their entirety or in part. The cycle can be repeated to form a film of a predetermined thickness.

FIG. 4 illustrates a schematic top-view diagram of a multi-chamber processing system 400 according to embodiments of the present disclosure. The processing system 400 generally includes a factory interface 402, load lock chambers 404, 406, transfer chambers 408, 410 with respective transfer robots 412, 414, holding chambers 416, 418, and processing chambers 420, 422, 424, 426, 428, 430. As detailed herein, wafers in the processing system 400 can be processed in and transferred between the various chambers without exposing the wafers to an ambient environment exterior to the processing system 400 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 400. Accordingly, the processing system 400 may provide an integrated solution for some processing of a plurality of wafers.

Examples of a processing system that may be suitably modified in accordance with the teachings provided herein include the PICOSUN® Sprinter ALD system, the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 4, the factory interface 402 includes a docking station 440 and factory interface robots 442 to facilitate transfer of wafers. The docking station 440 is configured to accept one or more front opening unified pods (FOUPs) 444. In some examples, each factory interface robot 442 generally comprises a blade 448 disposed on one end of the respective factory interface robot 442 configured to transfer the wafers from the factory interface 402 to the load lock chambers 404, 406.

The load lock chambers 404, 406 have respective ports 450, 452 coupled to the factory interface 402 and respective ports 454, 456 coupled to the transfer chamber 408. The transfer chamber 408 further has respective ports 458, 460 coupled to the holding chambers 416, 418 and respective ports 462, 464 coupled to processing chambers 420, 422. Similarly, the transfer chamber 410 has respective ports 466, 468 coupled to the holding chambers 416, 418 and respective ports 470, 472, 474, 476 coupled to processing chambers 424, 426, 428, 430. The ports 454, 456, 458, 460, 462, 464, 466, 468, 470, 472, 474, 476 can be, for example, slit valve openings with slit valves for passing wafers therethrough by the transfer robots 412, 414 and for providing a seal between respective chambers to prevent a gas from passing between the respective chambers. Generally, any port is open for transferring a wafer therethrough. Otherwise, the port is closed.

The load lock chambers 404, 406, transfer chambers 408, 410, holding chambers 416, 418, and processing chambers 420, 422, 424, 426, 428, 430 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 142 transfers a wafer from a FOUP 444 through a port 450 or 452 to a load lock chamber 404 or 406. The gas and pressure control system then pumps down the load lock chamber 404 or 406. The gas and pressure control system further maintains the transfer chambers 408, 410 and holding chambers 416, 418 with an interior low pressure or vacuum environment (which may include an inert gas). Hence, the pumping down of the load lock chamber 404 or 406 facilitates passing the wafer between, for example, the atmospheric environment of the factory interface 402 and the low pressure or vacuum environment of the transfer chamber 408.

With the wafer in the load lock chamber 404 or 406 that has been pumped down, the transfer robot 412 transfers the wafer from the load lock chamber 404 or 406 into the transfer chamber 408 through the port 454 or 456. The transfer robot 412 is then capable of transferring the wafer to and/or between any of the processing chambers 420, 422 through the respective ports 462, 464 for processing and the holding chambers 416, 418 through the respective ports 458, 460 for holding to await further transfer. Similarly, the transfer robot 414 is capable of accessing the wafer in the holding chamber 416 or 418 through the port 466 or 468 and is capable of transferring the wafer to and/or between any of the processing chambers 424, 426, 428, 430 through the respective ports 470, 472, 474, 476 for processing and the holding chambers 416, 418 through the respective ports 466, 468 for holding to await further transfer. The transfer and holding of the wafer within and among the various chambers can be in the low pressure or vacuum environment provided by the gas and pressure control system.

The processing chambers 420, 422, 424, 426, 428, 430 can be any appropriate chamber for processing a wafer. In some embodiments, the processing chamber 420 can be capable of performing an annealing process, the processing chamber 422 can be capable of performing a cleaning process, and the processing chambers 424, 426, 428, 430 can be capable of performing epitaxial growth processes. In some examples, the processing chamber 422 can be capable of performing a cleaning process, the processing chamber 420 can be capable of performing an etch process, and the processing chambers 424, 426, 428, 430 can be capable of performing respective epitaxial growth processes. The processing chamber 422 may be a SiCoNi™ Preclean chamber available from Applied Materials of Santa Clara, Calif. The processing chamber 420 may be a Selectra™ Etch chamber available from Applied Materials of Santa Clara, Calif.

A system controller 490 is coupled to the processing system 400 for controlling the processing system 400 or components thereof. For example, the system controller 490 may control the operation of the processing system 400 using a direct control of the chambers 404, 406, 408, 416, 418, 410, 420, 422, 424, 426, 428, 430 of the processing system 400 or by controlling controllers associated with the chambers 404, 406, 408, 416, 418, 410, 420, 422, 424, 426, 428, 430. In operation, the system controller 490 enables data collection and feedback from the respective chambers to coordinate performance of the processing system 400.

The system controller 490 generally includes a central processing unit (CPU) 492, memory 494, and support circuits 496. The CPU 492 may be one of any form of a general-purpose processor that can be used in an industrial setting. The memory 494, or non-transitory computer-readable medium, is accessible by the CPU 492 and may be one or more of memory such as random-access memory (RAM), read only memory (ROM), floppy disk, hard disk, or any other form of digital storage, local or remote. The support circuits 496 are coupled to the CPU 492 and may comprise cache, clock circuits, input/output subsystems, power supplies, and the like. The various methods disclosed herein may generally be implemented under the control of the CPU 492 by the CPU 492 executing computer instruction code stored in the memory 494 (or in memory of a particular process chamber) as, for example, a software routine. When the computer instruction code is executed by the CPU 492, the CPU 492 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 408, 410 and the holding chambers 416, 418. In other examples, more or fewer transfer chambers (e.g., one transfer chamber) and/or more or fewer holding chambers (e.g., no holding chambers) may be implemented as a transfer apparatus in a processing system.

Reference throughout this specification to “one embodiment,” “certain embodiments,” “one or more embodiments” or “an embodiment” means that a particular feature, structure, material, or characteristic described in connection with the embodiment is included in at least one embodiment of the disclosure. Thus, the appearances of the phrases such as “in one or more embodiments,” “in certain embodiments,” “in one embodiment” or “in an embodiment” in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A plasma-enhanced atomic layer deposition (PEALD) batch processing chamber comprising:

a housing with a lid, two opposed sidewalls, and a bottom defining an interior volume;

a wafer processing region within the interior volume, the wafer processing region including a wafer cassette therein and the wafer cassette comprising a plurality of platforms, wherein the plurality of platforms comprises a first set of platforms alternating with a second set of platforms, the second set of platforms are electrically grounded, and some of the first set of platforms are floated by adding a capacitor to the alternating second set of platforms that are adjacent to the floated first set of platforms, and each of the second set of platforms is configured to support at least one wafer for processing; and one or more RF power sources electrically connected to the plurality of platforms in the wafer cassette, wherein the plasma-enhanced atomic layer deposition (PEALD) batch processing chamber is configured to process the at least one wafer, and at least one of the one or more RF power sources comprises a capacitively coupled plasma (CCP) source.

2. The plasma-enhanced atomic layer deposition (PEALD) batch processing chamber of claim 1, wherein the first set of platforms is interspersed with the second set of platforms.

3. The plasma-enhanced atomic layer deposition (PEALD) batch processing chamber of claim 1, wherein the first set of platforms are electrically connected to at least one RF power source.

4. The plasma-enhanced atomic layer deposition (PEALD) batch processing chamber of claim 1, comprising a process gap in a range of from 4 mm to 12 mm between each of the first set of platforms and the alternating adjacent second set of platforms.

* * * * *